US006292057B1

(12) United States Patent
Corsi et al.

(10) Patent No.: US 6,292,057 B1
(45) Date of Patent: Sep. 18, 2001

(54) OUTPUT STAGE OF AN OPERATIONAL AMPLIFIER AND METHOD HAVING A LATCHUP-FREE SOURCING CURRENT BOOSTER FOR DRIVING LOW IMPEDANCE LOADS

(75) Inventors: Marco Corsi; Priscilla Escobar-Bowser, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/459,949

(22) Filed: Dec. 13, 1999

Related U.S. Application Data

(60) Provisional application No. 60/112,778, filed on Dec. 18, 1998.

(51) Int. Cl.[7] ........................................... H03F 3/26
(52) U.S. Cl. ................................. 330/273; 330/274
(58) Field of Search .................................. 330/262, 270, 330/271, 273, 274

(56) References Cited

U.S. PATENT DOCUMENTS

| 5,049,834 | 9/1991 | Kasai ........................................ 330/255 |
| 5,442,320 | 8/1995 | Kunst et al. ............................. 330/267 |
| 5,471,173 | 11/1995 | Moore et al. ............................ 330/256 |
| 5,491,437 | 2/1996 | Rincon et al. ........................... 330/257 |
| 5,500,625 | 3/1996 | Rincon et al. ........................... 330/273 |
| 5,646,576 | 7/1997 | Feldt et al. ............................. 330/263 |
| 5,684,432 | * 11/1997 | Embree ................................. 330/273 |
| 5,699,015 | 12/1997 | Dotson et al. ......................... 330/255 |
| 5,798,673 | 8/1998 | Griffith et al. ........................ 330/255 |
| 5,952,881 | * 9/1999 | Chiozzi et al. ....................... 330/273 |
| 5,963,093 | * 10/1999 | Corsi .................................... 330/173 |

* cited by examiner

Primary Examiner—Robert Pascal
Assistant Examiner—Khanh Van Nguyen
(74) Attorney, Agent, or Firm—April M. Mosby; W. James Brady; Frederick J. Telecky, Jr.

(57) ABSTRACT

Responsive to an external load, an output stage (201) of an amplifier (200) in accordance with the present invention provides a current boosting scheme capable of generating a large output current while maintaining a low quiescent current. The output stage (201) includes a sink control circuit (204) coupled to the input terminal (202) for receiving the output of the input amplifier stage. A translinear loop circuit (210) is coupled to the sink control circuit (204), for receiving the sink pass-through current and for producing a source pass-through current. A current mirror circuit (222) is coupled to the translinear loop circuit (210) for receiving the source pass-through and for producing a bias current output therefrom. An output driver (230) is coupled to the current mirror circuit (222) and the sink control circuit (204), wherein the output driver (230) receives the bias output current and the sink pass-though current to provide an output current. Accordingly, the output stage (200) provides a power efficient bias solution for driving low impedance loads with enhanced sourcing capability of high positive power supply rejection ratio, high output voltage swing, and stable negative feedback architecture.

20 Claims, 3 Drawing Sheets

OUTPUT STAGE OF AN OPERATIONAL AMPLIFIER AND METHOD HAVING A LATCHUP-FREE SOURCING CURRENT BOOSTER FOR DRIVING LOW IMPEDANCE LOADS

This application claims benefit to Provisional Application No. 60/112,778 filed Dec. 18, 1998.

FIELD OF THE INVENTION

This invention relates generally to the field of operational amplifiers; and, in particular, to an output stage and method having a latchup-free sourcing current booster capable of driving low impedance loads.

BACKGROUND OF THE INVENTION

Well known in monolithic integrated circuit design, the design of bias circuitry internal to the chip is very critical since it determines the internal voltage and current levels over all operating conditions of the integrated circuit as well as over all manufacturing process variations. The industry trend for electronic systems encompassing operational amplifiers is evolving toward lower operating voltages supplied from battery sources. Thus, amplifiers are used in applications requiring low voltage single supply operations in addition to traditionally desired operational amplifier properties such as high input impedance, low input offset voltage, low noise, high bandwidth, high speed and sufficient output drive capabilities. The operational amplifier consists of at least two stages: an input amplifier stage and an output stage. The input amplifier stage has the task of deriving the difference between the two inputs. The primary purpose of the output stage is voltage amplification. The output stage optionally has some sort of current boosting scheme which increases the amplifier's load capacity. Conventionally, amplifier output stages have used techniques involving combinations of transistors including npn, pnp and metal oxide semiconductor field effect transistors to satisfy many performance specifications, such as low crossover distortion, large output voltage swings including rail to rail performance, excellent phase and gain margins, low output impedance and symmetrical source and sink capabilities. A well-designed output stage should achieve these performance specifications while consuming low quiescent power and not limiting the frequency response of the amplifier.

During operation, an amplifier circuit consumes current from a power supply. A portion of this current, known as the quiescent current, is used to bias the internal circuitry of the amplifier. A low quiescent current is desirable because it reduces power consumption when the amplifier is operating at a light load, or with no load at all.

FIG. 1 illustrates a conventional output stage 10. This circuit schematic illustrates an embodiment of a traditional Class AB output stage 10 of an operational amplifier capable of driving a specified minimum impedance load while possessing a low quiescent current. Current source 12 provides quiescent biasing current $I_Q$ to drive the base of sourcing transistor 26. Sinking transistor 30 coupled in series with sourcing transistor 26 sinks current from the external load provided at output node 28. Current mirror transistor 22 has its base and emitter coupled to the base and emitter of the sinking transistor 30, respectively. In addition, the base of current mirror transistor 22 is coupled to input 16. Diode 14 is coupled in series between the collector of current mirror transistor 22 and the current source 12. The resistor 18 is coupled between the diode 14 and the output terminal of output stage 28. Diode 20 is coupled in parallel with resistor 18 to provide diode-resistor current limiting. Raising the quiescent current will drive lower impedance loads. This type of design modification, however, leads to too much standby power dissipation and; thus, is inefficient.

As is illustrated in FIG. 2a, another amplifier design 40 uses a simple boosting scheme to generate higher output current $I_{out}$ through the use of positive feedback. A current mirror circuit 44 formed by transistors 46 and 48 provides a boosting current $I_{boost}$ from the biasing current source 58 to drive the base of an sourcing transistor 52. The emitters of both current mirror transistors 46 and 48 are coupled to a first power supply rail 42 having power $V_{CC}$. The bases of both current mirror transistors 46 and 48 are tied together. Accordingly, the current mirror transistor 48 has a directly coupled base and collector. Resistor 50 has small resistance R coupled in parallel to the current mirror circuit 44 such that when the current of sourcing transistor 52 is small, the resistor 50 does not have any significant voltage drop across it. Current source 58 is coupled to the current mirror circuit 44 supplies a bias current $I_{bias}$ to drive the current mirror circuit 44. Current $I_{boost}$ provided by the current mirror 44 through current mirror transistor 46 drives the sourcing transistor 52. Boosting current $I_{boost}$ approximately equals the bias current $I_{bias}$. Current $I_{out}$ flows through sourcing transistor 52 to an output node 56. Sinking transistor 54 coupled in series with sourcing transistor 52 sinks current from the external load provided at output 56. Sinking transistor 54 is coupled to a input amplifier (not shown) at input node 60. As the current in sourcing transistor 52 increases, the voltage drop across resistor 50 increases. The current in first current mirror transistor 46 increases exponentially with the voltage increase across resistor 50. Thus, current in first current mirror transistor 46 grows exponentially as the current in sourcing transistor 52 increases linearly, making the boosting current $I_{boost}$ in current mirror circuit 44 non-linear. Once boosting current $I_{boost}$ has reached a level too high for sourcing transistor 52, transistor 52 will conduct heavily, raising the output to the power supply voltage level and causing the circuit to latch-up. Thus, the circuit ceases operation due to latch-up at higher output currents. Decreasing the value of resistance 50 in an effort to prevent the occurrence of latch-up, results in decreased boosting current $I_{boost}$, which defeats the purpose of providing a current boosting scheme. In conclusion, a limitation of this particular type of topology exists such that it may be used solely with external loads having a specified limited range. This limitation exists primarily because the biasing signal of this boosting scheme has no dependence upon the input signal; yet, biases the output stage 40 based upon its output signal.

FIG. 2b illustrates another conventional amplifier design 70 which uses another boosting scheme to generate higher output current $I_{out}$. This amplifier 70 includes an output driver having a sourcing transistor 78 coupled to sinking transistor 80 at a common output node 82. Transistor 76 includes a base coupled to the input signal 74, an emitter coupled to a first power supply reference 72 and a collector coupled to the base of the sourcing transistor 78. Current through transistor 76 provides ample boosting current $I_{boost}$ for the base of sourcing transistor 78. Accordingly, this design provides boosting current that is based upon both the input signal and the output signal of the amplifier and, thus, is capable of sourcing a large output current. The limitation of this design, however, is the existence of a low power supply rejection ratio.

Hence, a need exists for a versatile operational amplifier that can be used in a variety of applications, especially low voltage applications that does not diminish the characteristics of the operational amplifier. A need exists for an output stage that provides a variable quiescent current relative to the impedance load without the occurrence of latchup and high output voltage swing. A need exists for an output stage having an energy efficient design for low impedance loads and a stable negative feedback architecture that is linearly controlled.

SUMMARY OF THE INVENTION

An output stage of an operational amplifier having a sourcing current boosting scheme in accordance with the present invention generates a variable bias current and is capable of driving low impedance loads, while preventing the latch-up phenomenon. Through the use of a self-adjusting current boosting circuit, the bias current adjusts relative to the load. The present invention also provides an amplifier circuit that is operable to source a high current level relative to its bias current. Accordingly, this output stage is capable of having low quiescent current, while driving a large output current.

The amplifier circuit includes an input amplifier stage, a first power supply reference and a second power supply reference. The output stage coupled to an external load has an output driver including a sourcing circuit coupled to a sinking circuit. The sourcing circuit sources output current to the external load and the sinking circuit sinks current from the external load both through a common output node. A sink control circuit couples the input amplifier stage to the sinking circuitry. This sink control circuit mirrors the current in the sinking circuit. A translinear loop circuit couples the sink control circuit to a first mirroring circuit. Accordingly, the translinear loop circuit is responsive to the sinking current signal to provide a bias current signal inversely proportional to the sinking current. Ultimately, this circuit adjusts the quiescent current through the sinking and sourcing circuits responsive to the external load. In addition, the current derived negative feedback within the translinear loop circuit successfully holds the bias current near the quiescent value. The first mirroring circuit couples the translinear loop circuit to the sourcing circuitry. This first mirroring circuit mirrors the bias current signal from the translinear loop circuit, providing adequate boosting current to drive the sourcing circuit. In summary, the output stage provides a power efficient bias solution with enhanced sourcing capability of high positive power supply rejection ratio, high output voltage swing, and stable negative feedback architecture.

A technical advantage of the present invention is that it is capable of sourcing a large output current even though it is biased at a low quiescent to reduce power consumption by the amplifier. This increases the power efficiency of the amplifier, especially at light loads. It also makes the amplifier compatible with requirements of modern applications.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

The present invention largely uses bipolar transistors. Nonetheless, certain parts of the invention can be alternatively implemented with MOSFET devices. Each transistor that can be implemented as either a bipolar or FET transistor is referred to as a general transistor in the following description. Each such general transistor has a first flow electrode, a second flow electrode, and a control electrode for controlling current flow between the flow electrodes. Charge carriers either electrons or holes that move between the flow electrodes of each general transistor originate at its first flow electrode and terminate at its second flow electrode. Current conduction between the two flow electrodes begins when the voltage between the control electrode and the first flow electrode reaches a specified threshold voltage level. The current, if any, flowing in the control electrode is much smaller than that otherwise moving between the flow electrodes.

For an implementation with a bipolar, its emitter, collector, and base electrodes respectively are the first flow, second flow, and control electrodes. These electrodes respectively are the source, drain, and gate electrode respectively for a FET implementation of a general transistor.

Figure 1:
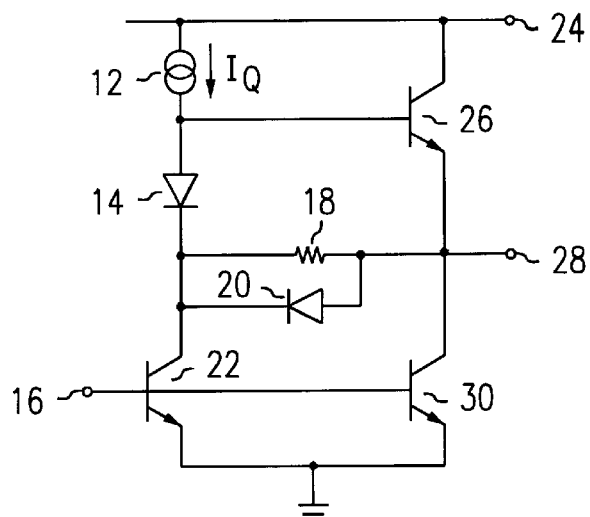
FIG. 1 is a schematic of a known output stage of an operational amplifier having a base current source.
Figure 2A:
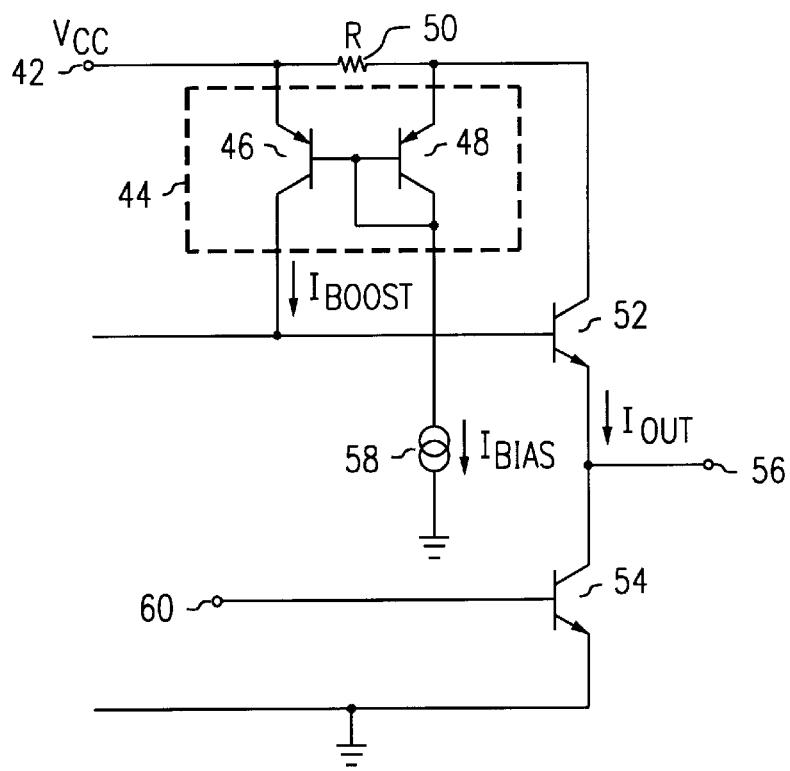
FIG. 2a is a schematic of a known output stage of an operational amplifier having a current boosting scheme.
Figures 2B, 3:
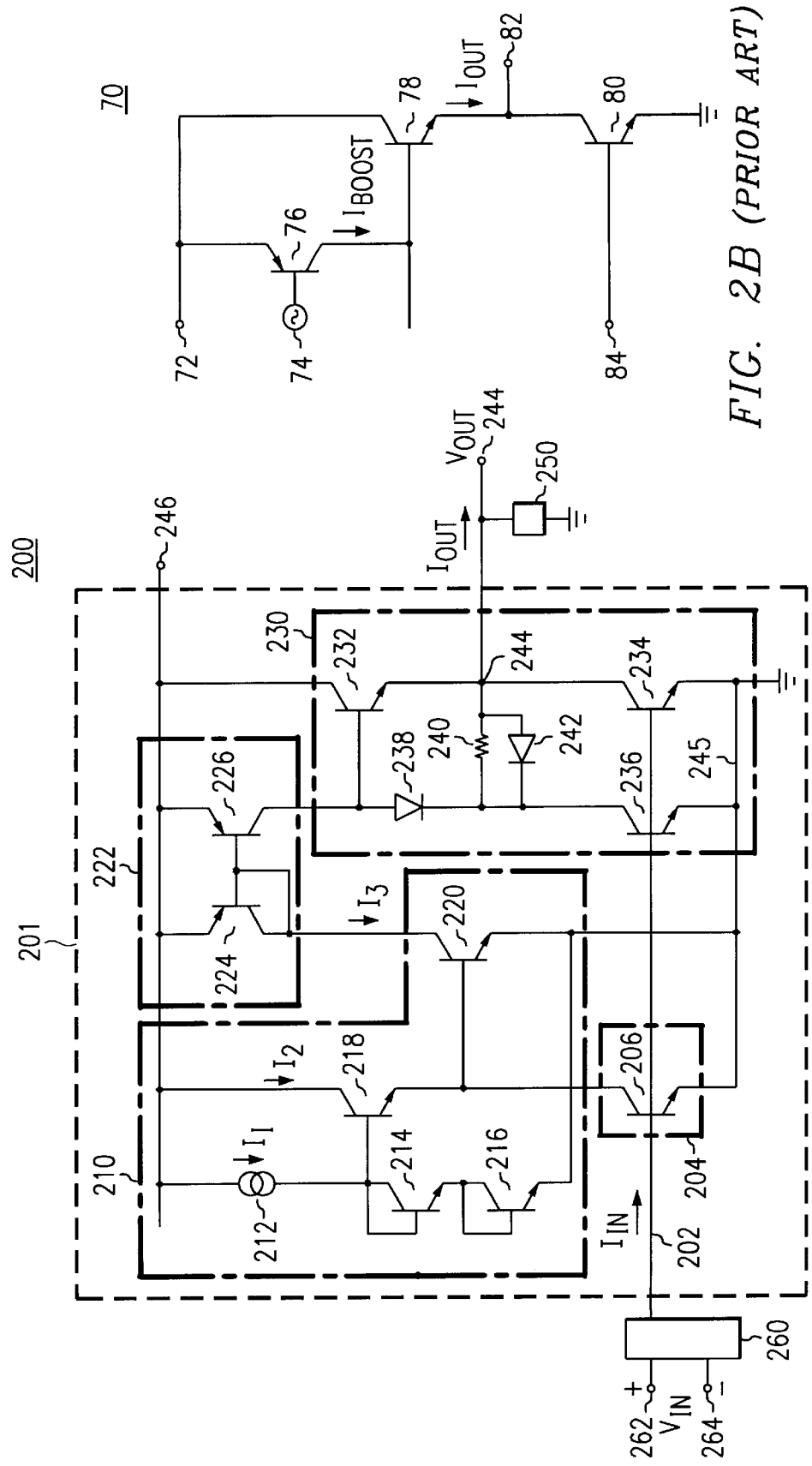
FIG. 2b is a schematic of a known output stage of an operational amplifier having an alternative current boosting scheme.
FIG. 3 is a schematic of an output stage of an operational amplifier having a current boosting scheme in accordance with the present invention.

FIG. 3 is a circuit schematic diagram of an amplifier 200 having an output stage 201 in accordance with the present invention. Amplifier 200 may operate to source and sink an output current to a load 250 attached to output 244. Amplifier 200 also includes an input amplifier stage 260 which may comprise any one of a number of conventional input or gain stages that provide an appropriately large gain. An input voltage $V_{in}$ is coupled to input terminals 262 and 264 of input amplifier stage 260. Output stage 201 is coupled to the input amplifier 260 at input node 202.

The output stage 201 is powered by a first power supply reference 246 and a second power supply reference 245. Although the second supply voltage reference 245 is shown as ground, it will be recognized that the output stage 201 could be powered via a split supply having positive and negative supply voltage references wherein the first power supply reference 246 remains $+V_{BB}$ and the second power supply reference 245 is designated, for example, $-V_{BB}$.

The output stage 201 includes a sink control circuit 204, a translinear loop circuit 210, a current mirror circuit 222 and an output driver 230. The output stage 201 includes an input node 202 for receiving an input voltage $V_{in}$ from input amplifier stage 260. The sink control circuit 204 includes current sinking sensor transistor 206 having a base coupled to the input node 202, an emitter coupled to ground, and a collector. As shown transistor 206 is a single NPN bipolar junction transistor. An input current $I_{in}$ through input node 202 drives transistor 206.

The translinear loop circuit 210 is coupled in series between the collector of the current sinking sensor transistor 206 and the current mirror circuit 222. Translinear loop circuit 210 includes a current source 212, a first diode drop transistor 214, a second diode drop transistor 216, a first bias transistor 218, and a second bias transistor 220. Transistors 214, 216, 218 and 220 are NPN bipolar junction transistors. Current source 212 establishes the operating point and is coupled to the first power supply reference 246. The first diode drop transistor 214 has an emitter and a directly coupled collector and base. The current source 212 is coupled to the directly coupled collector and base of first diode drop transistor 214. Second diode drop transistor 216 having an emitter coupled to ground and a directly coupled collector and base is coupled in series with the first diode drop transistor 214. The collector of second npn diode drop transistor 216 is coupled to the emitter of the first diode drop transistor 214. Current source 212 causes current flow $I_1$ in the two diode drop transistors 214 and 216. First bias transistor 218 has a collector coupled to first power supply reference 246, a base coupled to output terminal of current source 212 and an emitter coupled to the collector of current sinking sensor transistor 206. Second bias transistor 220 has an emitter coupled to ground, a base coupled to the emitter of the first bias transistor 218 and a collector.

Kirchhoff voltage loop equations provide that:

$$V_{be-214} + V_{be-216} - V_{be-218} - V_{be-220} = 0$$

$$\frac{kT}{q} \ln \frac{I_{214}}{A_{214}I_s} + \frac{kT}{q} \ln \frac{I_{216}}{A_{216}I_s} - \frac{kT}{q} \ln \frac{I_2}{A_{218}I_s} - \frac{kT}{q} \ln \frac{I_3}{A_{220}I_s} = 0$$

$$I_3 = (I_{214}I_{216}A_{218}A_{200})/(A_{214}A_{216}I_2)$$

$$I_3 = (I_1^2 A_{218}A_{220})/(A_{214}A_{216}I_2)$$

where $V_{be-214}$, $V_{be-216}$, $V_{be-218}$, and $V_{be-220}$ represent the base-emitter voltages of transistors 214, 216, 218 and 220, respectively; $A_{214}$, $A_{216}$, $A_{218}$ and $A_{220}$ represent the emitter area of each respective transistor; $I_S$ is the inverse saturation current; and $I_1 = I_{214} = I_{216}$. Thus, sinking current $I_2$ of the first bias transistor 218 is inversely proportional to boosting current $I_3$ of second bias transistor 220. Boosting current $I_3$ is proportional to the square of the current $I_1$ provided by current source 212. Accordingly, when the sinking current $I_2$ increases, the boosting current $I_3$ decreases.

The current mirror circuit 222 is coupled in series between translinear loop circuit 210 and output driver 230. The current mirror circuit 222 has a first and second current mirror transistor, 224 and 226, respectively. Transistors 224 and 226 are PNP bipolar junction transistors. Current mirror circuit 222 provides a means of establishing the dc bias levels within the circuit within the accuracy of the matching or tracking properties of its monolithic components. The first current mirror transistor 224 has an emitter coupled to the power supply reference 246 and a directly coupled base and collector. The collector of first current mirror transistor 224 is coupled to the collector of second bias transistor 220 in translinear loop circuit 210. The base of the second current mirror transistor 226 is coupled to the base of the first current mirror transistor 224. The emitter of the second current mirror transistor 226 is coupled to the first power supply reference 246.

The output driver includes a pair of diodes, 238 and 242, a sourcing and sinking circuitry, transistors 232 and 234, respectively, a current mirror transistor 236 and a resistor 240. Transistors 232, 234, and 236 are NPN bipolar junction transistors. The sourcing transistor 232 has a base coupled to the collector of the second current mirror transistor 226, a collector coupled to the first power supply reference 246 and an emitter. The sinking transistor 234 has a collector coupled to the emitter of the sourcing transistor 232, an emitter coupled to the second power supply reference 245 and a base. The current mirror transistor 236 has a base coupled to the base of the sinking transistor 234 and the base of the current sensor transistor 206, an emitter coupled to the second power supply reference 245 and a collector. The diode 238 of output driver 230 is coupled in series between the collector of the current mirror transistor 226 and the collector of current mirror transistor 236. The resistor 240 is coupled between the diode 238 and the output node 244. Diode 242 is coupled in parallel to the resistor 240 to provide diode-resistor current limiting.

In operation, amplifier 200 amplifies an input signal $V_{in}$ at input terminals 262 and 264 to produce an output signal $V_{out}$ for load 250 at node 244. Using the conventional voltage follower configuration, the output signal $V_{out}$ of the output stage 201 is fed back into the negative terminal 264 of the input amplifier stage 260. An input signal $V_{in}$ is fed into the positive terminal 262 of the input amplifier stage 260. The operational amplifier 200 compares the output signal $V_{out}$ with the input signal $V_{in}$, adjusting the output signal $V_{out}$ to match the magnitude of the input signal. When the input voltage changes creating a difference between the output and the input signals, $V_{out}$ and $V_{in}$, the output stage 201 will compensate for the difference in voltage. The difference is eliminated using the sourcing and sinking circuitry 232 and 234 to source and sink current into the output node 244 raising and lowering the output voltage $V_{out}$, respectively.

Accordingly, the output stage 201 either sources current to load 250 or sinks current from load 250. In sourcing current to load 250, the output of amplifier stage 201 is brought to a high potential voltage. This causes transistors 234 and 236 to conduct an insignificant amount of current. This is referred to as the "off" state of transistors 234 and 236. It is noted that transistors 234 and 236 are coupled such that the base current of 234 is mirrored or replicated in transistor 236. The current mirror circuit 222 provides a sufficient amount of current to drive sourcing transistor 232. The current in second current mirror transistor 226 increases when the current in sourcing transistor 232 decreases and visa versa. The boosting scheme prevents latch-up since (1) the boosting scheme depends on the amplifier's 200 input signal Vin and output signal Vout; and (2) the translinear loop 210 within the boosting scheme follows the amplifier's 200 main feedback. The sourcing and sinking transistors, 232 and 234, alternate operation to provide an output current $I_{out}$ through output node 244 to load 250. When the current in sinking transistor 234 decreases, it signifies that the output stage 201 is sourcing current. Accordingly, the current in current sinking sensor 206 decreases. Since the sinking current $I_2$ is inversely proportional to boosting current $I_3$, when the sinking current $I_2$ decreases (turning sinking transistor 234 off), boost current $I_3$ increases (turning sourcing transistor 232 on). The current mirror 222 mirrors the boosting current $I_3$ and, thus, provides more current to drive the sourcing transistor 232.

Output stage 201 may also act as a current sink for load 250. Note, however, the biasing provided by translinear loop 210 does not provide current boosting for the sinking capability of the amplifier 200. Accordingly, when the current in sinking transistor 234 increases, the current in current sinking sensor 206 increases, and consequently, the sinking current $I_2$ in first bias transistor 218 increases. During the sinking operation, the boosting current decreases and, thus, the sourcing transistor 232 turns off and the quiescent current in the output stage 200 is reduced. As aforementioned, the first diode drop transistor 216, second diode drop transistor 214, first bias transistor 218 and second bias transistor 220 form a translinear loop circuit providing boosting current $I_3=I_1^2/I_2$*constant. Current sinking sensor 206, sinking transistor 234 and current mirror transistor 236 are NPN bipolar junction transistors that have their bases and emitters tied together to form a current mirror circuit; thus, the current in current sinking sensor transistor 206 and current mirror transistor 236 are equivalent to the current in sinking transistor 234. Whenever sinking current in sinking transistor 234 increases, the sinking current $I_2$ through bias transistor 218 increases which triggers the boosting current $I_3$ to decrease due to the fixed reference voltage across them.

At the quiescent point, setting sinking current $I_2$ such that second bias transistor 220 has very little current, creates an optimum quiescent point where a small amount of quiescent output current $I_{out}$ runs through sourcing and sinking transistors, 232 and 234. Decreasing the current in first bias transistor 218 increases the current in second bias transistor 220. The driving capability for sourcing transistor 232 is established by the translinear loop 210 and is proportional to $I_1^2$ times the dc common-emitter current gain $h_{fe}$ of transistor 232. Hence, to establish the driving capability for sinking transistor 234, the current in first bias transistor 218 will increase and, as a result, decrease the current in second bias transistor 220. This approach allows the flexibility required to control the sourcing current. It also provides a controlled feature for lowering the quiescent output current $I_{out}$.

When sinking large amounts of current, however, the amount of current in current mirror transistor 236 and sinking transistor 234 is large. Therefore, it is necessary to provide a path for the current to not saturate current mirror transistor 236 and not destroy the linearity of the circuit by increasing the gain β of the output stage 200. Resistor 240 provides this additional path for the current. The voltage potential across resistor 240 will increase until the diode 238 turns on. By controlling the current through diode 238, the current through sourcing transistor 232 is controlled. At the quiescent point, the current through second current mirror transistor 226 flows through diode 238 and transistor 236; and thus, biases the sourcing transistor 232 and sinking transistor 234.

This embodiment provides a power efficient bias solution with no burdensome positive feedback. Additionally, the present invention has high positive power supply rejection ratio having no supply reference capacitors. Characteristics of amplifier 200 include operation at a low quiescent current and an output voltage within the range from approximately the value of a power supply voltage down to a ground potential.

Figure 4:
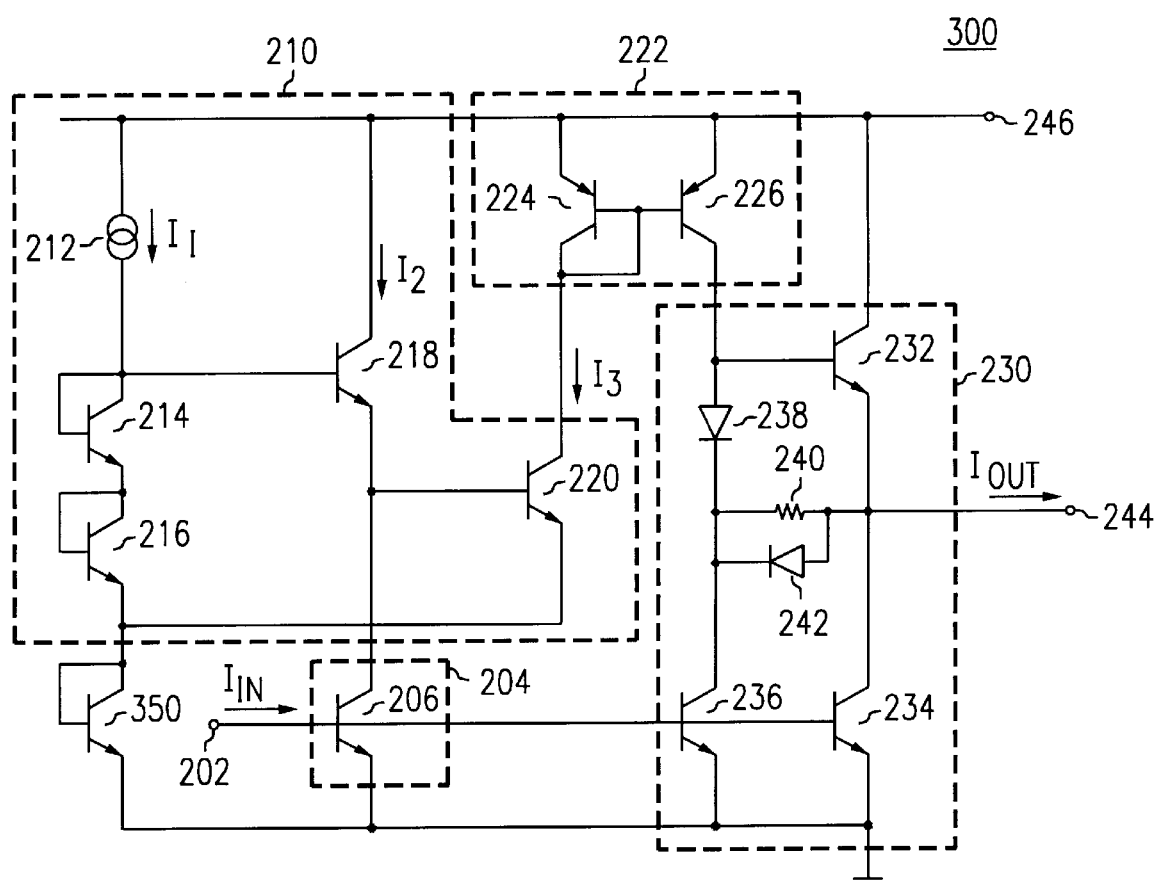
FIG. 4 is schematic of another embodiment of an output stage of an operational amplifier having a current boosting scheme in accordance with the present invention.

FIG. 4 is an illustration in schematic form of an alternate output stage 300. The alternate output stage 300 is substantially identical to the output stage 201 illustrated in FIG. 3, except that it provides a level shift transistor 350 to enhance the operating point of the output stage. The level shift transistor 350 has an emitter coupled to ground and a directly coupled base and collector coupled to the emitter of the first bias transistor 218 of the translinear loop circuit 210. The translinear loop circuit 210 operates on its own virtual ground which is the collector and base of level shift transistor 350.

The circuit of FIG. 3 operates adequately without level shift transistor 350; yet, the current sinking sensor transistor 206 may be placed closer to saturation than desired. As in FIG. 3, the voltage potential across current sinking sensor transistor 206 when the translinear loop circuit 210 is grounded is twice the amount of voltage drop from base to emitter, $2V_{be}$. When the circuit begins sinking and sourcing strongly the base to collector junction of current sinking sensor transistor 206 could become transiently forward biased.

If the level shift transistor 350 is included in the design of the output stage as in FIG. 4, level shift transistor 350 enhances the operating point, raising voltage potential across current sinking sensor transistor 206 to three times the amount of voltage drop from base to emitter, $3V_{be}$. Thus, the design provides more bandwidth and less chance of saturation. If more collector to emitter voltage $V_{CE}$ of current sinking sensor 206 is required, inserting at least one diode between second bias transistor 220 and level shift transistor 350 will supply more voltage across the transistor current sinking sensor 206 to keep the base-collector junction reversed biased and; thus, supplying more gain.

As stipulated, the present invention largely uses bipolar transistors. Nonetheless, certain parts of the invention with the exclusion of the translinear loop 210 can be alternatively implemented with MOSFET devices.

Those skilled in the art to which the invention relates will appreciate that various substitutions, modifications and additions can be made to the described embodiments, without departing from the spirit and scope of the invention as defined by the claims.

What is claimed is:

1. An output stage of an amplifier circuit having an input amplifier stage, a first power supply reference and a second power supply reference, the output stage comprising:

an output driver including sourcing circuitry coupled to sinking circuitry, the sourcing circuitry and the sinking circuitry having a common output node, the sourcing circuitry operable to source an output current to an external load, the sinking circuitry operable to sink current from the external load;

a sink control circuit coupled to the sinking circuitry and operable to sense the current in the sinking circuitry for providing a sinking current signal proportional to the current in the sinking circuitry;

a translinear loop circuit coupled to the sink control circuitry, the translinear loop circuit responsive to the sinking current signal and operable to provide a bias current signal inversely proportional to the sinking current; and a first mirroring circuit coupled to the translinear loop circuit and the sourcing circuitry, the first mirroring circuit operable to mirror the bias current signal from the translinear loop circuit for driving the sourcing circuitry;

wherein the sourcing circuit includes a sourcing transistor having a collector coupled to the first reference power supply, a base directly coupled to the first mirroring circuit, and an emitter coupled to the common output node and the sinking circuit includes a sinking transistor having a collector coupled to the emitter of the transistor of the sourcing circuit, an emitter coupled to the second reference power supply and a base.

2. The output stage of an amplifier circuit as claimed in claim 1, wherein the output driver further includes:

a first current mirror transistor having a base coupled to the base of the transistor of the sinking circuit, an emitter coupled to the second reference power supply and a collector;

a first diode coupled between the base of the transistor of the sourcing circuit and the collector of the first current mirror transistor;

a resistor coupled between the first diode and the output terminal for preventing saturation of the first current mirror transistor; and a second diode coupled in parallel to the resistor.

3. The output stage of an amplifier circuit as claimed in claim 2, wherein the sinking transistor, the sourcing transistor and the first current mirror transistor of the output driver circuit are NPN bipolar junction transistors.

4. The output stage of an amplifier circuit as claimed in claim 1, wherein the sink control circuit includes a sink control transistor having an emitter coupled to the second reference power supply, a base terminal coupled to the input amplifier stage for receiving the input signal and a collector coupled to the translinear loop circuit.

5. The output stage of an amplifier circuit as claimed in claim 4, wherein the sink control transistor is a NPN bipolar junction transistor.

6. The output stage of an amplifier circuit as claimed in claim 1, wherein the translinear loop circuit includes:
- a current source coupled to the first reference power supply;
- at least two diode-drop transistors coupled in series with the current source, the diode-drop transistor having an emitter and a directly coupled base and collector, the directly coupled base and collector coupled in series to the current source
- a first bias transistor having a collector coupled to the first reference power supply, a base coupled to the current source, and an emitter coupled to the sink control circuit; and
- an second bias transistor having a base coupled to the emitter of the first bias transistor, an emitter coupled to the emitter of the second diode-drop transistor and a collector coupled to the first mirroring circuit.

7. The output stage of an amplifier circuit as claimed in claim 6, wherein the plurality of diode-drop transistors and the first and second bias transistor are NPN bipolar junction transistors.

8. The output stage of an amplifier circuit as claimed in claim 1, wherein the first mirroring circuit includes:
- a second current mirror transistor having an emitter coupled to the first reference power supply and a directly coupled collector and base, the collector is coupled to the translinear loop circuit; and
- a third current mirror transistor having an emitter coupled to the first reference power supply, a base coupled to the base of the first current mirror transistor and a collector coupled to the output driver.

9. The output stage of an amplifier circuit as claimed in claim 8, wherein the second and third current mirror transistor are PNP bipolar junction transistors.

10. The output stage of an amplifier circuit as claimed in claim 6, further comprising a level-shift transistor having an emitter coupled to the second power supply and a directly coupled base and collector, the collector of the level-shift transistor coupled to the emitter of the diode-drop transistor of the translinear loop circuit.

11. An output stage of an amplifier circuit having an input amplifier stage, a first power supply reference, a second power supply reference, the output stage comprising:
- an output driver including sourcing circuitry coupled to sinking circuitry, the sourcing circuitry and the sinking circuitry having a common output node, the sourcing circuitry operable to source an output current to an external load, the sinking circuitry operable to sink current from the external load;
- a sink control circuit coupled to the sinking circuitry and operable to sense the current in the sinking circuitry for providing a sinking current signal proportional to the current in the sinking circuitry, wherein the sink control circuit includes a transistor having an emitter coupled to the second reference power supply, a base terminal coupled to the input amplifier stage for receiving the input signal and a collector coupled to the translinear loop circuit;
- a translinear loop circuit responsive to the sinking current signal and operable to provide a bias current signal inversely proportional to the sinking current wherein the translinear loop circuit includes a current source coupled to the first reference power supply and at least two diode-drop transistors coupled in series with the current source, the first diode-drop transistor having an emitter and a directly coupled base and collector, the directly coupled base and collector is coupled to the current source, the second diode-drop transistor having an emitter coupled to the second power supply and a directly coupled base and collector coupled to the emitter of the first diode-drop transistor;
- a first mirroring circuit coupled to the translinear loop circuit and the sourcing circuitry, the first mirroring circuit operable to mirror the bias current signal from the translinear loop circuit for driving the sourcing circuitry;
- wherein the sourcing circuit includes transistor having a collector coupled to the first reference power supply, an emitter coupled to the common output node and a base;
- wherein the sinking circuit including transistor having a collector coupled to the emitter of the transistor of the sourcing circuit, an emitter coupled to the second reference power supply and a base;
- wherein the output driver further includes a first current mirror transistor having a base coupled to the base of the sinking transistor, an emitter coupled to the second reference power supply and a collector;
- wherein the output driver further includes a first diode coupled between the base of the sourcing transistor and the collector of the first current mirror transistor;
- wherein the output driver further includes a resistor coupled between the first diode and the output terminal for preventing saturation of the current mirror transistor;
- wherein the output driver further includes a second diode coupled in parallel to the resistor;
- wherein the translinear loop further includes at least two bias transistors, the first bias transistor having a collector coupled to the first reference power supply, a base coupled to the current source, and an emitter coupled to the collector of the transistor of the sink control circuit, the second bias transistor having a base coupled to the emitter of the first bias transistor, an emitter coupled to the emitter of the second diode-drop transistor and a collector; and
- wherein the first mirroring circuit includes a second current mirror transistor and a third current mirror transistor, the second current mirror transistor having an emitter coupled to the first reference power supply and a directly coupled collector and base, the collector is coupled to the collector of the second bias transistor of the translinear loop circuit, the third current mirror transistor having an emitter coupled to the first reference power supply, a base coupled to the base of the second current mirror transistor and a collector coupled to the output driver.

12. The output stage of the amplifier circuit as claimed in claim 11, wherein the sinking transistor, the sourcing transistor, the first current mirror transistor, the sink control transistor, the plurality of diode-drop transistors and the plurality of bias transistors are NPN bipolar junction transistors.

13. The output stage of the amplifier circuit as claimed in claim 11, wherein the second and third current mirror transistor are PNP bipolar junction transistors.

14. An output stage of an amplifier circuit having an input amplifier stage, the output stage comprising:

a sourcing circuitry operable to source an output current to an external load;

a sinking circuitry coupled to the sourcing circuitry and operable to sink current from the external load, the sourcing circuitry and the sinking circuitry having a common output node;

a first mirroring circuitry coupled to the sinking circuitry and operable to approximately mirror the current in the sinking circuitry;

a sink control circuit coupled to the first mirroring circuitry for providing sinking current responsive to the input amplifier stage, the sink control circuitry coupled to the first mirroring circuitry and operable to approximately mirror the current in the first mirroring circuitry;

a translinear loop circuit responsive to the sinking current, the translinear loop circuit coupled to the sink control circuit operable to provide a bias current inversely proportional to the sinking current for controlling the sinking and sourcing current relative to the external load; and a second mirroring circuitry directly coupled between the translinear loop circuit and the sourcing circuitry, the second mirroring circuitry operable to mirror the bias current from the translinear loop circuit for driving the sourcing circuitry.

15. An output stage of an amplifier circuit having an external load, comprising:

an input;

an output;

a negative feedback circuit coupled to the input for providing a bias current; and a driver circuit coupled to the negative feedback circuit, the driver circuit responsive to the bias current for supplying an output current to a load coupled to the output;

wherein the driver circuit includes
a first current mirror transistor having a base coupled to the base of the sinking transistor, an emitter coupled to the second reference power supply and a collector,
a first diode coupled between the base of the sourcing transistor and the collector of the first current mirror transistor,
a resistor coupled between the first diode and the common output node for preventing saturation of the current mirror transistor, and
a second diode coupled in parallel to the resistor;

wherein the negative feedback circuit adjusts the bias current in response to changes in the impedance of the load coupled to the output.

16. The output stage of the amplifier circuit of claim 15, wherein the driver circuit includes:

a sourcing circuitry coupled to sinking circuitry, the sourcing circuitry and the sinking circuitry having a common output node, the sourcing circuitry operable to source an output current to an external load, the sinking circuitry operable to sink current from the external load, wherein the sourcing circuit includes transistor having a collector coupled to the first reference power supply, an emitter coupled to the common output node and a base.

17. The output stage of the amplifier circuit of claim 14, wherein the negative feedback circuit includes:

a sink control circuit coupled to the sinking circuitry and operable to sense the current in the sinking circuitry for providing a sinking current signal proportional to the current in the sinking circuitry;

a translinear loop circuit responsive to the sinking current signal and operable to provide a bias current signal inversely proportional to the sinking current; and a second mirroring circuit coupled to the translinear loop circuit and the sourcing circuitry, the second mirroring circuit operable to mirror the bias current signal from the translinear loop circuit for driving the sourcing circuitry.

18. The output stage of the amplifier circuit of claim 17, wherein the sink control circuit includes a sink control transistor having an emitter coupled to the second reference power supply, a base terminal coupled to the input amplifier stage for receiving an input signal and a collector coupled to the translinear loop circuit.

19. The output stage of the amplifier circuit of claim 17, wherein the translinear loop circuit the includes:

a current source coupled to the first reference power supply and at least two diode-drop transistors coupled in series with the current source, the first diode-drop transistor having an emitter and a directly coupled base and collector, the directly coupled base and collector is coupled to the current source, the second diode-drop transistor having an emitter coupled to the second power supply and a directly coupled base and collector coupled to the emitter of the first diode-drop transistor;

at least two bias transistors, the first bias transistor having a collector coupled to the first reference power supply, a base coupled to the current source, and an emitter coupled to the sink control circuit, the second bias transistor having a base coupled to the emitter of the first bias transistor, an emitter coupled to the emitter of the second diode-drop transistor and a collector.

20. The output stage of the amplifier circuit of claim 17, wherein the second mirroring circuit includes a second current mirror transistor and a third current mirror transistor, the second current mirror transistor having an emitter coupled to the first reference power supply and a directly coupled collector and base, the collector coupled to the translinear loop circuit, the third current mirror transistor having an emitter coupled to the first reference power supply, a base coupled to the base of the second current mirror transistor and a collector coupled to the output driver.

* * * * *